US009755289B2

(12) United States Patent
Barnett et al.

(10) Patent No.: US 9,755,289 B2
(45) Date of Patent: Sep. 5, 2017

(54) RIGHT ANGLE TRANSITION TO CIRCUIT

(71) Applicant: NATIONAL INSTRUMENTS CORPORATION, Austin, TX (US)

(72) Inventors: Ron J. Barnett, Santa Rosa, CA (US); Gregory S. Gonzales, Sebastopol, CA (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 0 days.

(21) Appl. No.: 14/739,474

(22) Filed: Jun. 15, 2015

(65) Prior Publication Data

US 2016/0240909 A1 Aug. 18, 2016

Related U.S. Application Data

(60) Provisional application No. 62/117,547, filed on Feb. 18, 2015.

(51) Int. Cl.

| | |
|---|---|
| ***H01P 5/08*** | (2006.01) |
| ***H01P 3/08*** | (2006.01) |
| ***H03H 7/38*** | (2006.01) |
| ***H01P 3/06*** | (2006.01) |

(52) U.S. Cl.
CPC .................................... *H01P 5/085* (2013.01)

(58) Field of Classification Search
CPC ....................................................... H01P 5/085
USPC ............................................................ 333/33
See application file for complete search history.

(56) References Cited

U.S. PATENT DOCUMENTS

| | | | | |
|---|---|---|---|---|
| 4,383,226 | A | 5/1983 | Nygren et al. | |
| 4,837,529 | A * | 6/1989 | Gawronski | H01P 5/085 333/260 |
| 5,552,752 | A | 9/1996 | Sturdivant et al. | |
| 5,886,590 | A * | 3/1999 | Quan | H01P 5/085 333/260 |
| 5,963,111 | A | 10/1999 | Anderson et al. | |
| 7,049,903 | B2 | 5/2006 | Herstein et al. | |
| 2009/0212881 | A1 * | 8/2009 | Snodgrass | H01P 5/085 333/33 |

* cited by examiner

*Primary Examiner* — Stephen E Jones
*Assistant Examiner* — Scott S Outten
(74) *Attorney, Agent, or Firm* — Meyertons Hood Kivlin Kowert & Goetzel, P.C.; Jeffrey C. Hood; Mark S. Williams

(57) ABSTRACT

Right angle transition to circuit. A system includes a conductive plate, coaxial transmission line, a circuit, parallel to the conductive plate, and a right angle transition from the coaxial transmission line to the circuit. The transmission line includes a center pin protruding through a hole in the plate, an outer conductor formed by a conductive surface of the hole, and air dielectric between. The circuit includes a top conducting layer (TCL), ground plane with cutout, and an insulating substrate between the TCL and ground plane that abuts the pin. The transition includes the pin, a conductive element connecting the center pin to the TCL, the outer conductor, the air dielectric, the abutment of the substrate against the pin, and the cutout. The abutment and cutout minimize manufacturing variations regarding distance between the pin and the ground plane. The transition tunes out inductance introduced by bonding the pin to the TCL.

20 Claims, 11 Drawing Sheets

RIGHT ANGLE TRANSITION TO CIRCUIT

PRIORITY DATA

This application claims benefit of priority to U.S. Provisional Application Ser. No. 62/117,547, titled "Right Angle Transition to Microstrip Circuit", filed Feb. 18, 2015, whose inventors were Ron J. Barnett and Gregory S. Gonzales, and which is hereby incorporated by reference in its entirety as though fully and completely set forth herein.

FIELD OF THE INVENTION

The present invention relates to the field of circuit design, and more specifically, to a right angle transition to a circuit, e.g., for radio frequency (RF) systems.

DESCRIPTION OF THE RELATED ART

Many electronic devices include components, e.g., circuits, conductive plates, e.g., housings, and so forth, that must be interconnected to operate, including circuits with surface mount packages where components are mounted on the surface (floor) of a conductive housing or printed circuit board (PCB), and microstrip circuits, e.g., thin film circuits, where layers of material on the order of a nanometer to several micrometers thick are used, e.g., for optical coatings. In some applications, right angle transitions are used to transition from a conductive plate, such as a microcircuit housing with an orthogonal (right angle) coaxial transmission line, e.g., a subminiature push-on (SMP) connector, to a microstrip (e.g., thin film) circuit. Such circuit assemblies may be referred to as right angle (or vertical) launches, particularly in the radio frequency (RF) domain, although the term is used herein to refer to such assemblies in any frequency domain.

FIG. 1 illustrates an exemplary circuit assembly implementing a right angle launch 16, according to the prior art. As FIG. 1 shows, the (prior art) right angle launch 16 includes a conductive plate 14, e.g., microcircuit housing, coupled to a microstrip circuit 12, e.g., a thin film circuit. As may be seen, a center pin 10 of a coaxial transmission line protrudes orthogonally from the surface of conductive plate 14 through a hole 13, and electrically connects to a top conducting layer 18 of the microstrip circuit 12 via transition bond 17. The microstrip circuit 12 includes an insulating substrate 11, and below this insulating substrate 11 the microstrip circuit includes a ground plane 16. Note further that the surface of the hole 13 in the conductive plate 14 forms a coaxial outer conductor 15 with respect to the center pin 10 for the coaxial transmission line.

However, most right angle launches have poor input match, e.g., poor impedance matching, referred to as S11 (and possibly other S-Parameters) in the art of linear electrical networks in the RF domain, high return loss, etc. For example, in many cases, there may be unwanted capacitance produced by the proximity of a coaxial connector center pin, e.g., of an SMP connector of a microcircuit, to the conductive ground plane layer of a microstrip circuit. Moreover, this effect may be amplified by the fact that the center pin is at a right angle (90 degrees/orthogonal) with respect to the microstrip circuit. Note, for example, that since the center pin of a vertical or orthogonal coaxial connector, such as a subminiature push-on (SMP) connector, is at a right angle with respect to the top conductive layer and the ground plane of the microstrip circuit, the electric and magnetic fields of the coaxial connector are not aligned with those of the microstrip circuit components, and thus, the 90 degree transition between the circuits may further complicate input (e.g., impedance) matching between the circuits.

The main parasitic impedance in the assembly of FIG. 1 are: 1) the transition bond is inductive; and 2) the ground current in the coaxial transmission line on the coaxial outer conductor evenly all around the center pin has to flow underneath the microstrip circuit, which is another discontinuity that causes extra inductance. These discontinuities in the ground currents and the longer conductive transition bond is what makes a right angle (launch) transition so challenging with regards to reliable impedance matching, particularly in mass production.

Said another way, the unwanted capacitance due to discontinuities in the transition gives rise to impedance, and thus impedance mismatching, which produces unwanted signal reflections due to inductance introduced in bonding (transitioning) over from the vertical connector to a horizontal substrate, which becomes progressively more of a problem with increased frequency. The effects of most attempts to tune out this inductance are limited due to variations in implementation. For example, tolerances in manufacturing processes often introduce variance in the relative geometry of the circuits to be joined, e.g., variation in the distance between the center pin and the ground plane of the microstrip circuit, with resultant variance in the inductance, which leads to corresponding variations in the impedances, and mismatches thereof.

In other words, due to variations in the proximity that can occur in mass production, i.e., each produced circuit assembly may have a different degree of proximity between the vertical center pin and the ground plane of the microstrip circuit, and thus, different impedance values, which makes impedance matching difficult and unreliable. Additionally, higher frequencies, e.g., RF, generate greater inductance in the assembly, which also increases impedance, thereby exacerbating impedance matching problems.

SUMMARY OF THE INVENTION

Various embodiments of a right angle transition to a microstrip circuit, e.g., for radio frequency (RF) systems, are presented.

A system, such as a circuit assembly, may include a conductive plate, a coaxial transmission line and a circuit. The coaxial transmission line may include a center pin protruding orthogonally through a hole in the conductive plate, an outer conductor formed by a conductive surface of the hole, and air dielectric between the center pin and the outer conductor. The circuit may be parallel to the conductive plate, and may include a top conducting layer, a ground plane, including a cutout, and an insulating substrate between the top conducting layer and the ground plane, where the insulating substrate of the circuit abuts the center pin of the coaxial transmission line. The ground plane may be affixed to the conductive plate. The system may further include a right angle transition from the coaxial transmission line to the circuit, wherein the right angle transition includes the center pin of the coaxial transmission line, a conductive element that electrically connects the center pin of the coaxial transmission line to the top conducting layer of the circuit, the outer conductor, the air dielectric between the center pin and the outer conductor, the abutment of the insulating substrate of the circuit against the center pin of the coaxial transmission line, and the cutout. In one embodiment, the cutout may be coaxial with the center pin. Moreover, in various embodiments, the cutout may be one or more of circular, elliptical, rectangular, or polygonal. The abutment and the cutout may operate to minimize manufacturing variations regarding distance between the center pin and the ground plane. Moreover, during operation the right angle transition may tune out inductance introduced by bonding the center pin of the coaxial transmission line to the top conducting layer.

In some embodiments, the cutout may be a first cutout, and the hole in the conductive plate may form a second cutout with a larger radius than the first cutout. The right angle transition may thus further include the second cutout. For example, the ground plane may be affixed to the conductive plate by a bonding medium, and the difference in radii of the first and second cutouts may accommodate bonding medium bleed-out at the second cutout edge without causing capacitance variation that would mistune the right angle transition. As with the first cutout, in some embodiments, the second cutout may be coaxial with the center pin.

In some embodiments, the conductive plate may be or include a microcircuit housing, and the circuit may be or include a microstrip circuit, e.g., a thin film circuit, although the techniques disclosed herein are broadly applicable to other types of components or circuits, as well.

BRIEF DESCRIPTION OF THE DRAWINGS

A better understanding of the present invention can be obtained when the following detailed description of the preferred embodiment is considered in conjunction with the following drawings, in which.

Figure 1:
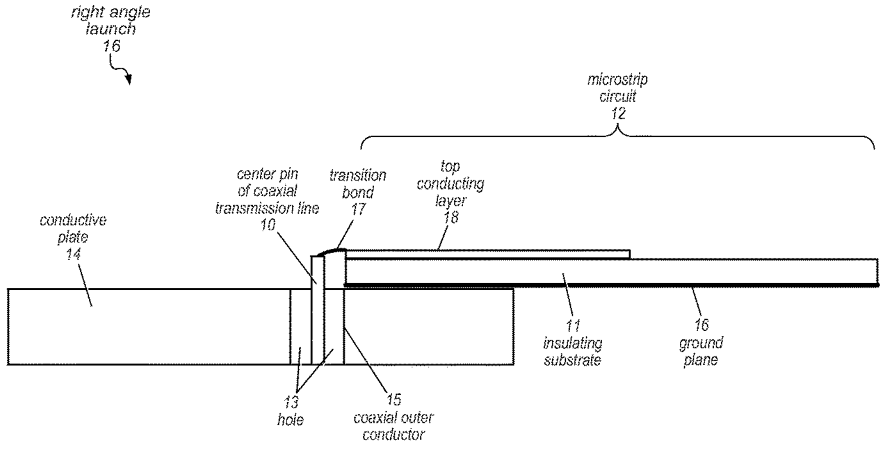
Figure 1 (Prior Art)
FIG. 1 illustrates an exemplary right angle launch, according to the prior art.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

Concurrent—refers to parallel execution or performance, where tasks, processes, or programs are performed in an at least partially overlapping manner. For example, concurrency may be implemented using "strong" or strict parallelism, where tasks are performed (at least partially) in parallel on respective computational elements, or using "weak parallelism", where the tasks are performed in an interleaved manner, e.g., by time multiplexing of execution threads.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within 0.1% of the target value, within 0.2% of the target value, within 0.5% of the target value, within 1%, 2%, 5%, or 10% of the target value, and so forth, as required by the particular application of the present techniques.

Circuit Transmission Line—refers to a electrical (e.g., signal) path on or in a circuit.

Coplanar Wave Guide—refers to a type of circuit transmission line used to convey microwave frequency signals. Coplanar wave guides may be fabricated using printed circuit board (PCB) technology.

Microstrip—refers to a type of circuit transmission line used to convey microwave frequency signals, consisting of a conducting strip separated from a ground plane by a dielectric layer (referred to as the substrate). Microstrips may be fabricated using printed circuit board (PCB) technology.

Stripline—refers to a type of circuit transmission line, specifically, a transverse electromagnetic (TEM) transmission medium.

Circuit—refers to a network of electrical or electronic components with a closed loop that provides a return path for current.

Circuit Medium—refers to any of various types of materials used to implement circuit boards.

Printed Circuit Board—refers to a circuit board made up of copper sheets and organic dielectric pressed together, e.g., copper foil conductors laminated on organic dielectrics, and is sometimes called a softboard.

Low Temperature Cofired Ceramic—refers to laminated ceramics held in organic material and fired out at 900 C to form a multilayer ceramic board with gold, copper, and/or silver metal traces silkscreened on the board.

High Temperature Cofired Ceramic—refers to laminated ceramics held in organic material and fired out at 1700 C to form a multilayer ceramic board with high temperature metal traces silkscreened on the board.

Thin Film—refers to a circuit medium comprising layers of material on the order of a nanometer to several micrometers thick, e.g., for optical coatings.

Thin Film Circuit—refers to a circuit wherein conductive traces are evaporated and plated on ceramic substrates such as alimuna, aluminum nitride, quartz, sapphire, glass, and so forth.

Thick Film—refers to a circuit medium made via an additive process involving deposition of several successive layers of conductor, resistors and dielectric layers onto an electrically insulating substrate using a screen-printing process.

Thick Film Circuit—refers to a circuit wherein conductive traces are silk screened and fired on ceramic substrates such as alimuna and aluminum nitride.

Overview

Embodiments of the present invention may provide for improved matching, e.g., S11, between a conductive plate, such as a microcircuit housing with a coaxial connector, and a microstrip circuit with a right angle transition, via one or more of the following novel features:

1) a cutout in the ground plane of the microstrip circuit that reduces the center pin to ground capacitance by just the right amount to provide wide band impedance matching;

2) the microstrip circuit abuts, i.e., is pushed up against, the center pin of the (e.g., coaxial) connector to minimize assembly variations; and/or 3) the ground plane cutout has a smaller radius then the hole in the conductive plate over which it is positioned to further minimize assembly variation, providing a place for excess bonding medium (e.g., epoxy or solder) to go (bleed-out or ooze) without causing capacitance variation that would mistune the transition.

Use of these novel features may result in a right angle transition to a microstrip circuit with improved input return loss that is not sensitive to assembly variation. Moreover, the transition may operate over a broad frequency range, e.g., from direct current (DC) through 40 GHz range of the (e.g., coaxial) connector, with better impedance specifications than the connector itself.

Embodiments of the novel techniques disclosed herein may thus provide novel techniques to tune out extra inductance in such assemblies in a wide band manner, i.e., over a broad frequency range, and further, to provide or assemble a right angle transition (also referred to herein as a right angle launch transition) so that the manufacturing variations are minimized.

Exemplary Systems

Embodiments of the present invention may be involved with manufacturing, testing, and measurement, in the RF domain, e.g., regarding RF systems, including, for example, controlling and/or modeling instrumentation or industrial automation hardware, particularly; modeling and simulation functions, e.g., modeling or simulating a device or product being developed or tested, etc. Exemplary test applications contemplated include hardware-in-the-loop testing and rapid control prototyping, among others.

However, it is noted that embodiments of the present invention can be used for a plethora of applications and is not limited to the above applications. In other words, applications discussed in the present description are exemplary only, and embodiments of the present invention may be used in any of various types of systems. Thus, embodiments of the system and method of the present invention is configured to be used in any of various types of applications, including the control of other types of devices such as multimedia devices, video devices, audio devices, telephony devices, e.g., cellular telephones, Internet devices, etc., as well as network control, network monitoring, financial applications, games, etc.

Figure 2A:
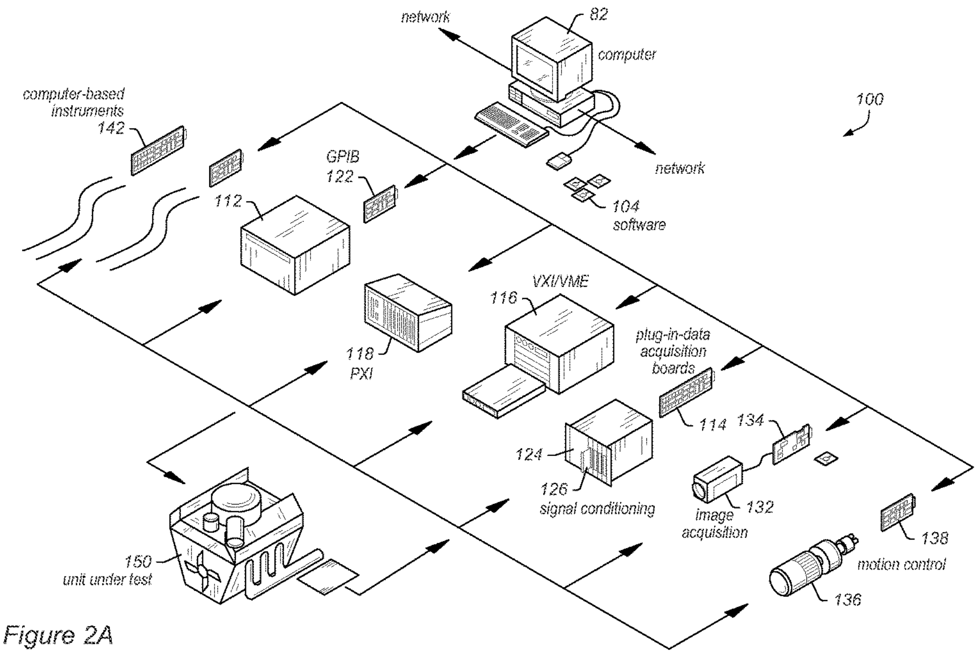
FIG. 2A illustrates an exemplary instrumentation control system according to one embodiment of the invention.

FIG. 2A illustrates an exemplary instrumentation control system 100 which may implement embodiments of the invention. The system 100 comprises a host computer 82 which couples to one or more instruments. The host computer 82 may comprise a CPU, a display screen, memory, and one or more input devices such as a mouse or keyboard as shown. The computer 82 may operate with the one or more instruments to analyze, measure or control a unit under test (UUT) or process 150, e.g., via execution of software 104.

The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices. The computer system may couple to and operate with one or more of these instruments. The instruments may be coupled to the unit under test (UUT) or process 150, or may be coupled to receive field signals, typically generated by transducers. The system 100 may be used in a data acquisition and control application, in a test and measurement application, an image processing or machine vision application, a process control application, a man-machine interface application, a simulation application, or a hardware-in-the-loop validation application, among others.

Figure 2B:
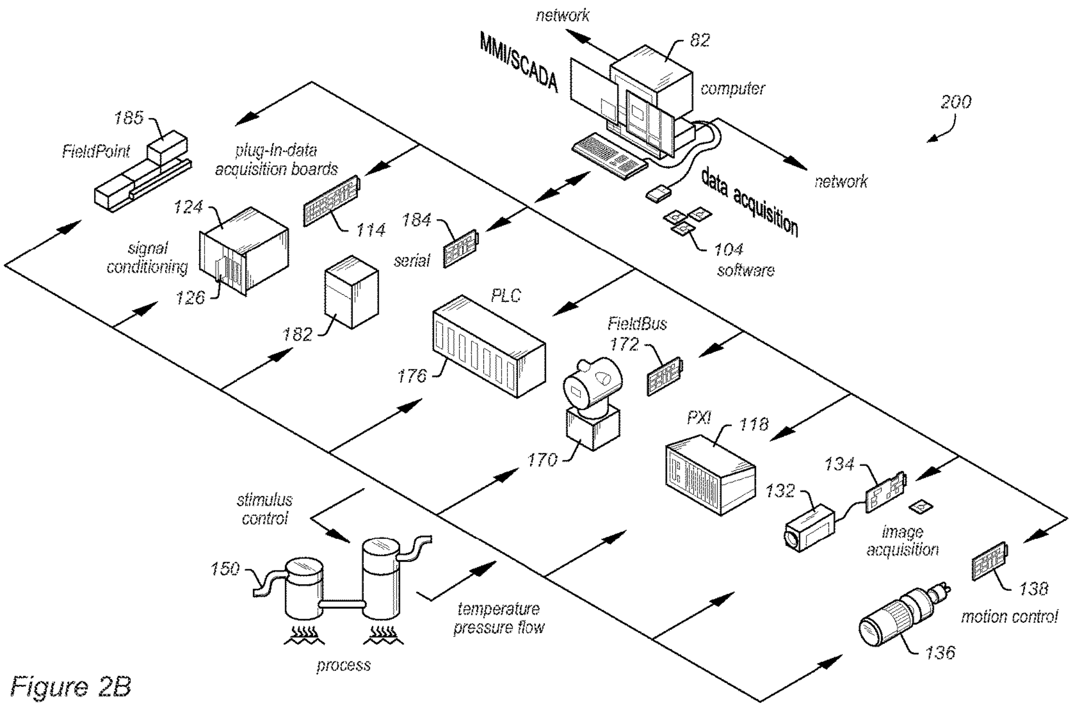
FIG. 2B illustrates an exemplary industrial automation system according to one embodiment of the invention.

FIG. 2B illustrates an exemplary industrial automation system 200 which may implement embodiments of the invention. The industrial automation system 200 is similar to the instrumentation or test and measurement system 100 shown in FIG. 2A. Elements which are similar or identical to elements in FIG. 2A have the same reference numerals for convenience. The system 200 may comprise a computer 82 which couples to one or more devices or instruments. The computer 82 may comprise a CPU, a display screen, memory, and one or more input devices such as a mouse or keyboard as shown. The computer 82 may operate with the one or more devices to perform an automation function with respect to a process or device 150, such as MMI (Man Machine Interface), SCADA (Supervisory Control and Data Acquisition), portable or distributed data acquisition, process control, advanced analysis, or other control, among others, e.g., via execution of software 104.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a fieldbus device 270 and associated fieldbus interface card 172, a PLC (Programmable Logic Controller) 176, a serial instrument 282 and associated serial interface card 184, or a distributed data acquisition system, such as Fieldpoint system 185, available from National Instruments Corporation, among other types of devices.

Figure 3A:
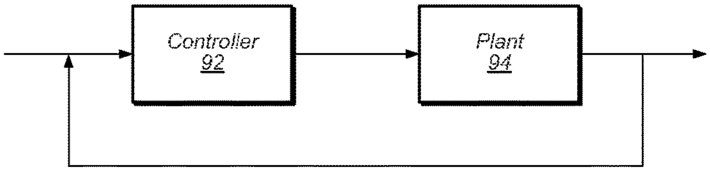
FIG. 3A is a high level block diagram of an exemplary system configured to utilize embodiments of the present invention.

FIG. 3A is a high level block diagram of an exemplary system which may execute or utilize embodiments of the techniques disclosed herein. FIG. 3A illustrates a general high-level block diagram of a generic control and/or simulation system which comprises a controller 92 and a plant 94. The controller 92 represents a control system/algorithm the user may be trying to develop. The plant 94 represents the system the user may be trying to control. For example, if the user is designing an ECU for a car, the controller 92 is the ECU and the plant 94 is the car's engine (and possibly other components such as transmission, brakes, and so on.) Circuits implementing the functionality of one or both of the controller 92 and the plant 94 may utilize embodiments of the techniques presented.

Figure 3B:
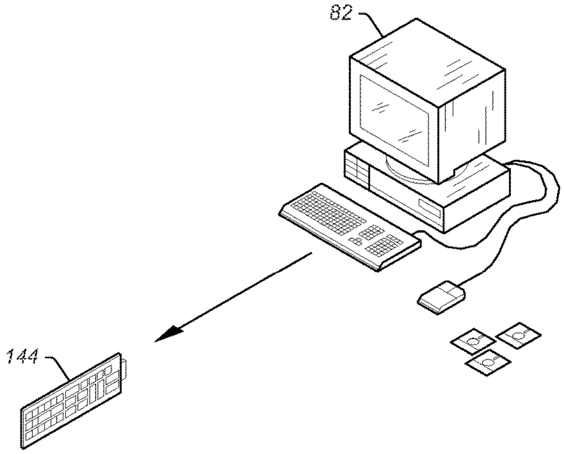
FIG. 3B illustrates an exemplary system which may perform control and/or simulation functions utilizing embodiments of the present invention.

FIG. 3B illustrates an exemplary system which may perform control and/or simulation functions. As shown, the controller 92 may be implemented by a computer system 82 or other device (e.g., including a processor and memory medium and/or including a programmable hardware element) that executes or implements a program. In a similar manner, the plant 94 may be implemented by a computer system or other device 144 (e.g., including a processor and memory medium and/or including a programmable hardware element) that executes or implements a program, or may be implemented in or as a real physical system, e.g., a car engine. One or more of the controller or device may include circuit assemblies according to embodiments of the techniques described herein.

Figure 4:
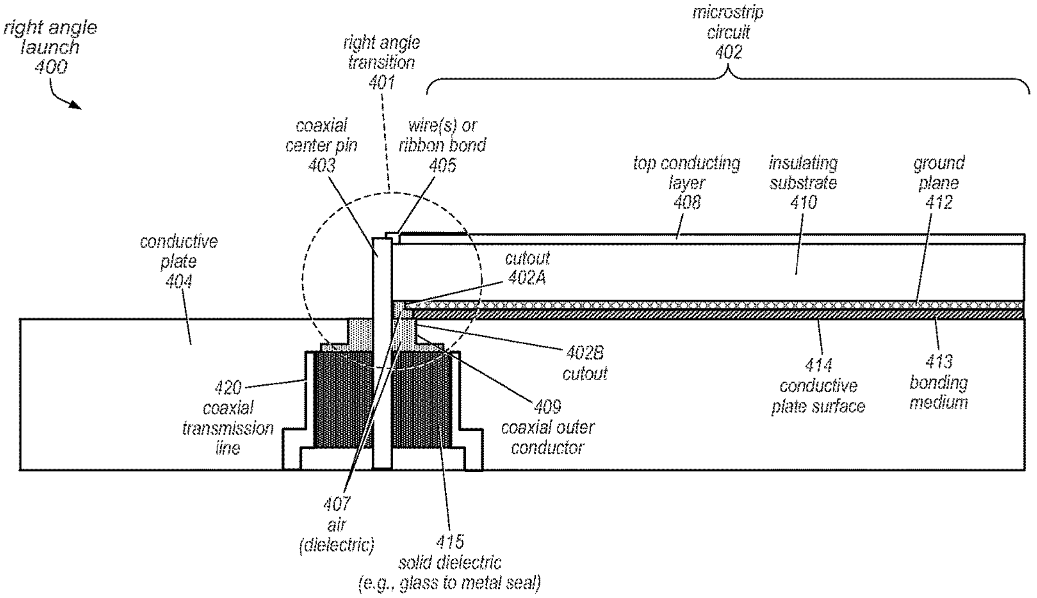
FIG. 4 illustrates an exemplary right angle transition to a circuit, according to one embodiment of the present invention.

FIG. 4—Exemplary Right Angle Launch with Right Angle Transition

FIG. 4 illustrates an exemplary circuit assembly implementing a right angle launch 400 with a right angle transition (or right angle launch transition) 401, according to one embodiment. As FIG. 4 shows, the right angle launch 400 includes a conductive plate 404, e.g., a microcircuit housing, coupled to a circuit, in this embodiment, microstrip circuit 402. The circuit 402 may be parallel to the conductive plate 404. The right angle launch 400 may further include a coaxial transmission line 420, comprising a (coaxial) center pin 403 which may protrude orthogonally from or through a hole in a surface 414 of the conductive plate 404, an outer (coaxial) conductor 409 formed by a conductive surface of the hole, and an air dielectric 407 between the center pin and the outer conductor 409. In some embodiments, the coaxial transmission line 420 may further include a solid dielectric material 415, e.g., a glass to metal seal, as shown in FIG. 4.

Similar to the circuit assembly of FIG. 1, the (e.g., microstrip) circuit 402 may include a top conducting layer 408, an insulating substrate 410, and a ground plane 412 below the insulating substrate 410. Thus, the circuit may include the top conducting layer, the ground plane, and an insulating substrate between the top conducting layer and the ground plane. The ground plane 412 may further be affixed to the conductive plate 404.

As noted above, the right angle launch may further include a right angle transition 401 from the coaxial transmission line to the circuit 402. The right angle transition (401) may electrically couple the coaxial transmission line to the circuit, and thereby may electrically couple the conductive plate to the circuit. For example, the coaxial transmission line may electrically bond or connect (via wire or ribbon bond 405) to the top conducting layer 408 of the microstrip circuit 402 via right angle transition 401. As indicated, this electrical bond 405 may be implemented as a wire bond (e.g., via one or more wires) or a ribbon bond.

Note that the insulating substrate of the circuit abutting the center pin of the coaxial transmission line is in direct contrast with the prior art assembly shown in FIG. 1, in which the circuit 12 (specifically, the insulating substrate 11) does not make contact with the center pin 10. In some embodiments, the ground plane 412 includes a cutout 402A, e.g., where the insulating substrate abuts the center pin of the coaxial transmission line, as shown. In other words, the ground plane 412 may not extend all the way to the center pin, although the insulating substrate does. Note that the size and shape of this cutout defines the distance from the center pin to the edge of the (cutout 402A of the) ground plane (which may be referred to as a capacitive stub in the ground plane), and reliable sizing/manufacture of this cutout thus results in a reliable distance therebetween. Said another way, the combination of the abutment and the cutout 402A may operate to remove or at least minimize (or ameliorate) manufacturing variations regarding the distance between the center pin and the ground plane. The cutout may be coaxial with the center pin. In this embodiment, the cutout 402A is circular (i.e., forms at least part of a circle), corresponding to the circular cross-section shape of the center pin 403, although non-circular variations are also contemplated. In other words, the cutout may be shaped in any of a variety of ways, e.g., in accordance with or geometrically similar to the cross-section shape of the center pin. More generally, in various embodiments, the cutout may any of a variety of shapes, e.g., may be one or more of: circular, elliptical, rectangular, or polygonal, although other shapes may be used as desired.

The use of a cutout in the ground plane may thus provide for greater standardization of the distance between the right angle launch, e.g., the axial connector 406, and the ground plane. For example, the non-linear relationship between proximity and resulting capacitance means that increasing the distance between the connector and the edge of the ground plane by some amount operates to decrease the corresponding capacitance by a greater amount. Thus, by sizing/shaping the cutout appropriately, the corresponding capacitance may be reduced to a value below some specified threshold. Thus, providing a circuit (e.g., microstrip) ground plane with a cutout may tune out inductance caused by the right angle (or right angle) launch.

Accordingly, in some embodiments, the right angle transition 401 may include the center pin of the coaxial transmission line, a conductive element that electrically connects the center pin of the coaxial transmission line to the top conducting layer of the circuit, the outer conductor, the air dielectric between the center pin and the outer conductor, the abutment of the insulating substrate of the circuit against the center pin of the coaxial transmission line, and the cutout, where the abutment and the cutout operate to minimize manufacturing variations regarding distance between the center pin and the ground plane. Moreover, during operation the right angle transition may tune out inductance introduced by bonding the center pin of the coaxial transmission line to the top conducting layer.

In some embodiments, the cutout 402A may be a first cutout, and the hole in the conductive plate may form a second cutout 402B with a larger radius than the first cutout. The right angle transition may further include the second cutout 402B. For example, as also shown in FIG. 4, in some embodiments, the ground plane may be affixed to the surface of the conductive plate (e.g., microcircuit housing) by a bonding medium, e.g., epoxy or solder, although any other bonding medium may be used as desired. The difference in radii of the first and second cutouts may accommodate bonding medium bleed-out at the second cutout edge without causing capacitance variation that would mistune the right angle transition. In other words, in manufacturing the circuit assembly/right angle launch, at least some small amount of bonding medium typically bleeds or squeezes out at the edge of the hole where the ground plane is bonded to the surface of the conductive plate, referred to herein as "bleedout" or "runout". In prior art approaches, this bleedout generally changes the capacitance between the ground plane and the center pin, and thus introduces variation, which complicates the tuning (matching) of the assembly. The second cutout 402B radius may be larger than that of the first cutout 402A such that any bleedout/runout is sufficiently far from the center pin and the edge of the first cutout (and thus the ground plane) as to have negligible impact on the capacitance between the ground plane and the center pin. In other words, making the second cutout 402B radius larger than the first cutout 402A radius may put the bleedout far enough away from the ground plane edge and the center pin that it does not have significant impact on the capacitance, e.g., the impact is negligible, i.e., is within acceptable tolerance. In some embodiments, the second cutout 402B is coaxial with the center pin.

Thus, as FIG. 4 shows, in some embodiments, the right angle transition 401 may include cutouts 402A and 402B, where cutout 402A is in the ground plane 412, and cutout 402B is in the conductive plate 404, specifically, the hole in the conductive plate through which the coaxial center pin 403 protrudes (and whose surface includes the coaxial outer conductor).

Note that in various other embodiments, the circuit may be of any of a variety of types, i.e., may have any of a variety of circuit mediums (e.g., circuit board materials) and any of a variety of circuit transmission lines (and accordant manufacturing techniques). For example, the exemplary circuit of FIG. 4 is or includes a microstrip circuit, but in other embodiments, the circuit may be or include at least one of a thin film circuit, a thick film circuit, or a printed circuit board (PCB), among others.

For example, in an embodiment where circuit is or includes a printed circuit board (PCB) instead of a microstrip circuit, the conductive plate 404 may be coupled to the PCB, where the connector, e.g., the center pin 403 of the coaxial connector, protrudes from (or through) the surface of the conductive plate 404 and electrically connects to a top conducting layer (or conducting element) of the PCB via vertical launch transition 401. For convenience, the techniques presented herein are described in terms of microstrip circuit embodiment, although it should be noted that the techniques are broadly applicable to PCB embodiments, as well.

Additionally, embodiments of the right angle transition described herein may be used in any of a variety of frequency domains. For example, in some embodiments, the right angle transition may be employed in RF applications/systems, although the techniques disclosed are also applicable to other frequency ranges, e.g., any frequency ranges between DC (direct current) and approximately 50 GHz, or higher.

Figure 5:
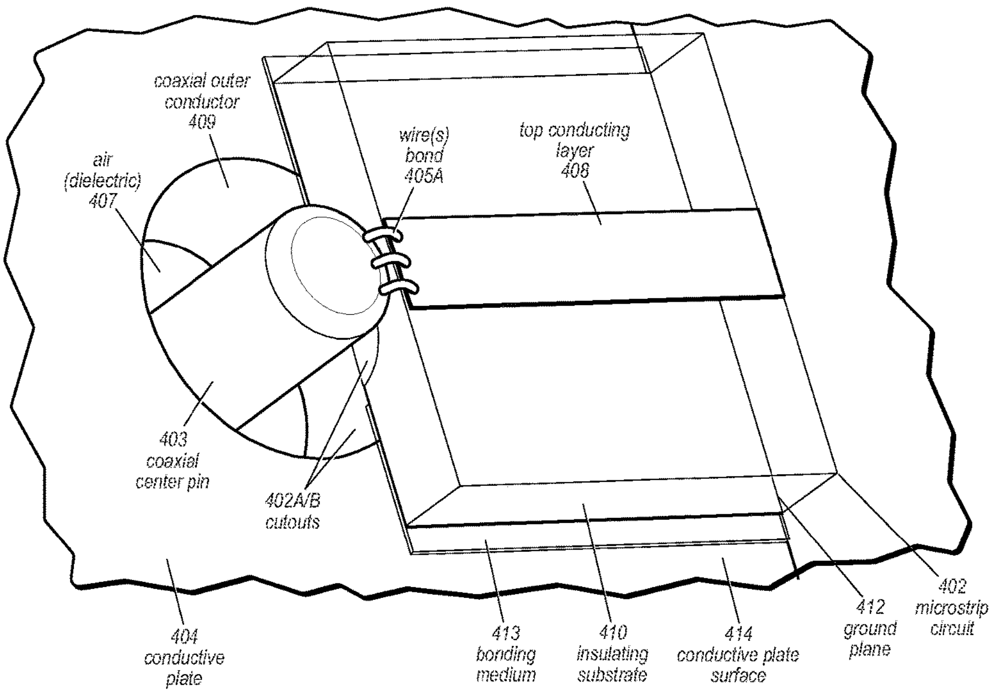
FIG. 5 is a perspective view of an exemplary right angle transition implemented with a wire bond, according to one embodiment.

FIG. 5—Exemplary Circuit Assembly with Wire Bond Based Transition

FIG. 5 is a perspective view of an exemplary right angle transition implemented with a wire bond, according to one embodiment. Note that system elements in common with the embodiment of FIG. 4 are described above, and are not repeated here for brevity. As may be seen, in this exemplary embodiment, the conductive element that electrically connects the center pin of the coaxial transmission line to the top conducting layer of the circuit is a wire bond 405A that includes 3 wires. Note, however, that any number of wires may be used as desired.

Figure 6:
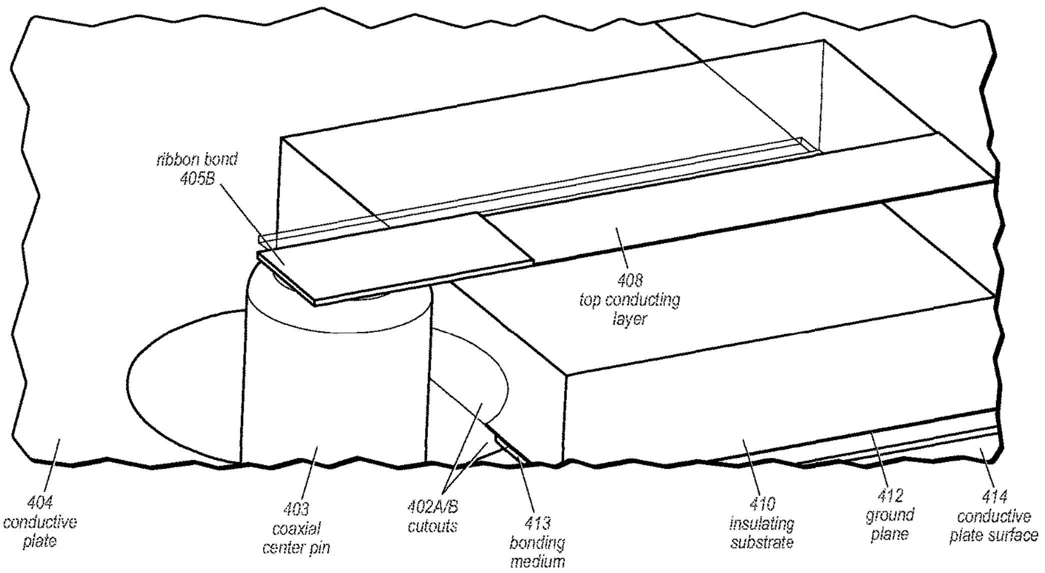
FIG. 6 illustrates a perspective view of an exemplary right angle transition implemented with a ribbon bond, according to an alternative embodiment.

FIG. 6—Exemplary Circuit Assembly with Ribbon Bond Based Transition

FIG. 6 illustrates a perspective view of an exemplary right angle transition implemented with a ribbon bond, according to an alternative embodiment. As with FIG. 5, system elements in common with the embodiment of FIG. 4 are described above.

In the particular embodiment shown, the center pin 403 is a 15 millimeter diameter pin, and is connected to the top conducting layer 408 of the circuit, in this case, a 10 millimeter wide trace, via a (conductive) 10 millimeter ribbon. Note, however, that the dimensions/sizes indicated are exemplary only, and that in other embodiments other component or element sizes may be used as desired.

Figure 7:
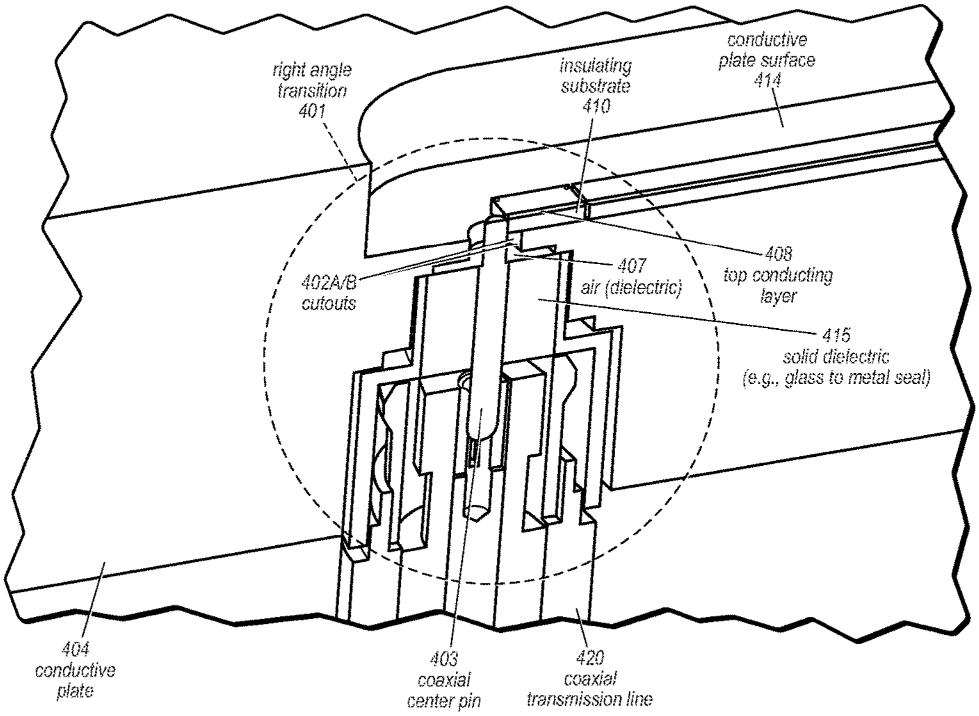
FIG. 7 is a detailed cutaway illustration of a right angle transition, according to one embodiment.

FIG. 7—Detailed Cutaway of Right Angle Transition

FIG. 7 is a detailed cutaway illustration of a right angle transition, according to one embodiment. In the exemplary embodiment shown, the coaxial transmission line 420 is or includes a subminiature push-on (SMP) connector, although other coaxial connectors may be used as desired. As noted above, in some embodiments, the coaxial transmission line 420 may further include a solid dielectric material 415, e.g., a glass to metal seal, as shown in FIG. 7. The glass to metal seal is soldered in the conductive plate, e.g., the microcircuit housing, i.e., the coaxial center pin is sealed to the outer conductor with glass, e.g., where one end of the pin is bonded to the inside of a microcircuit package, and the other end is outside the microcircuit package, which is what the SMP cable snaps into.

Figure 8:
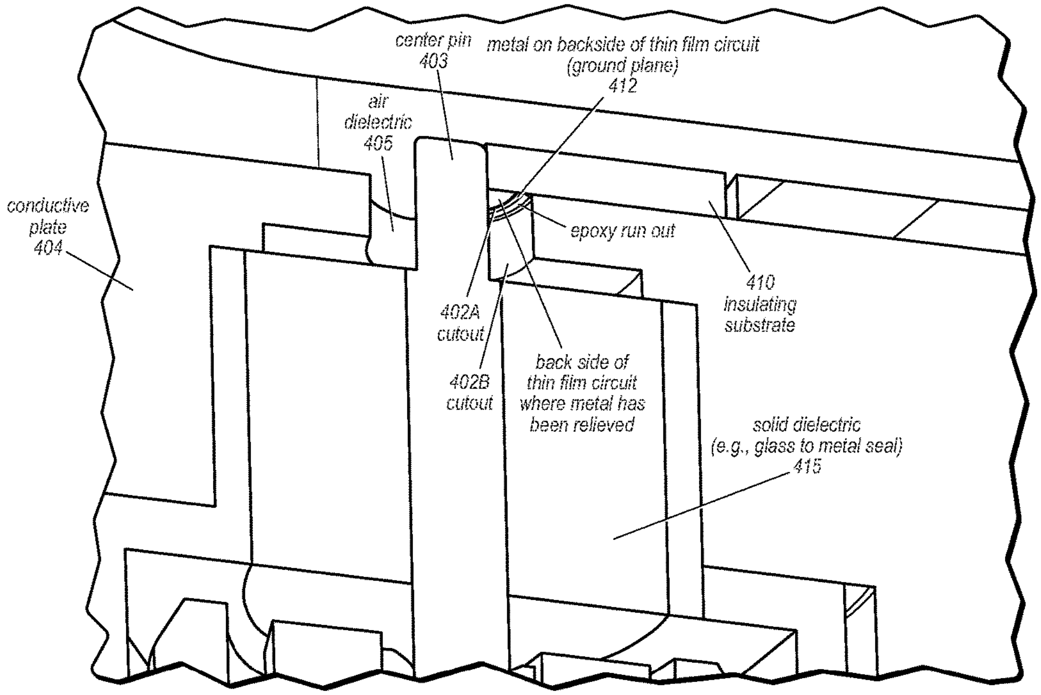
FIG. 8 is a more detailed cutaway illustration of the right angle transition of FIG. 7, according to one embodiment.

FIG. 8—More Detailed Cutaway of Right Angle Transition

FIG. 8 is a more detailed cutaway illustration of a right angle transition similar to that of FIG. 7, where the microstrip circuit is a thin film circuit, according to one embodiment. As may be seen, FIG. 8 shows the right angle transition from below, illustrating the cutouts 402A and 402B, as well as exemplary bonding medium (in this case, epoxy) runout/bleedout at the edge of the second cutout 402B. Note the backside or underside of the thin film circuit where the metal of the ground plane (labeled as "Metal on backside of Thin Film Circuit (ground plane 412)") is missing or omitted (has been relieved), thereby exposing the insulating substrate (which abuts the center pin 403). This is the first cutout 402A, and the circular hole in the conductive plate is the second cutout 402B. Further details are shown in FIG. 9.

Figure 9:
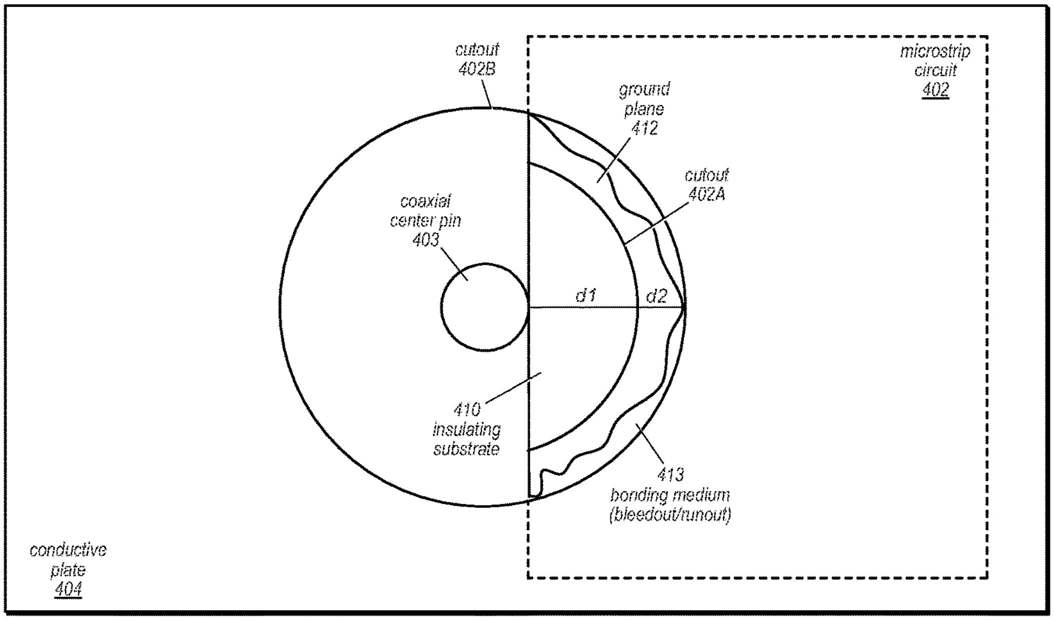
FIG. 9 is a detailed bottom view of a right angle transition, according to one embodiment.

FIG. 9—Detailed Bottom View of a Right Angle Transition

FIG. 9 is a detailed bottom view of an exemplary right angle transition, according to one embodiment, that particularly illustrates the geometric relationships between the coaxial center pin 403, the insulating substrate 410, the cutouts 402A/B, and bonding medium bleedout/runout 413, according to one embodiment.

As discussed above, the size and shape of cutout 402A cutout (in combination with abutment of the insulating substrate 410 against the center pin 403) defines the distance from the center pin to the edge of the (cutout 402A of the) ground plane (i.e., capacitive stub in the ground plane), and reliable sizing/manufacture of this cutout thus results in a reliable distance therebetween, denoted in FIG. 9 as d1. As also mentioned above, this precision removes variability in capacitance and related inductance, and thus facilitates tuning of the circuit assembly for improved impedance matching. While the cutouts shown are circular in accordance with the circular (cross-sectioned) center pin, other shapes may be used as desired.

As also mentioned above, in some embodiments, the bonding medium used to affix the ground plane of the microstrip circuit to the surface of the conductive plate may bleedout (or ooze) between the ground plane and the surface, and in prior art assemblies this bleedout generally changes the capacitance between the ground plane and the center pin, and introducing variation, and thus complicating the tuning (matching) of the assembly. Accordingly, in the present techniques, the second cutout 402B radius may be larger than that of the first cutout 402A (by distance d2), thereby providing enough room to accommodate the bleedout while keeping the bleedout material far enough away from the edge of the first cutout 402A and center pin 403 that the bleedout material does not appreciably change the capacitance therebetween. In other words, the second cutout 402B, formed by the hole in the conductive plate 404 through which the center pin 403 protrudes, defines a distance d2 from the edge of the hole and the first cutout 402A. The distance d2 may be specified such that the additional capacitance due to bleedout may be kept below some specified threshold, e.g., some specified fraction of the total capacitance, the value of which may depend on the application. Exemplary values of this threshold may include, but are not limited to, 0.01%, 0.02%, 0.05%, 0.1%, 0.2%, 0.5%, 1%, 2%, 5%, and so forth, depending on the particular application, e.g., frequency range, current, etc.

Thus, by judiciously specifying the distances d1 and d2, the circuit assembly (or right angle launch) may be reliably tuned for a good match (e.g., re impedance, e.g., S11).

It should be noted that the above described circuits are exemplary only, and that the disclosed techniques are broadly applicable to other types of circuits, as well. For example, note that microstrip is a type of circuit transmission lines, that thin film, thick film, and printed circuit board (PCB) are all types of circuit media, and that each of these types of circuit transmission line can be made in or on thin film, thick film, and PCB types of circuit materials, as desired.

Figure 10:
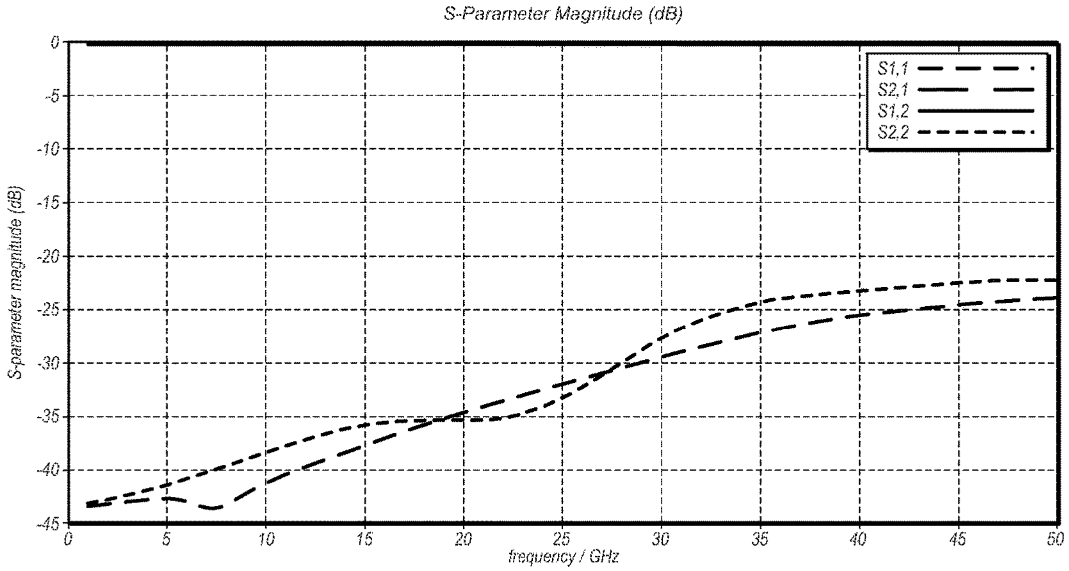
FIG. 10 illustrates modeled (computed) return loss of transition vs. frequency, according to one embodiment.

FIG. 10—Modeled Return Loss of Right Angle Transition vs. Frequency

FIG. 10 illustrates modeled (computed) return loss of transition vs. frequency for the right angle transition disclosed herein, according to one embodiment. More specifically, FIG. 10 shows computed values for S-Parameter (S11, S21, S12, and S22, denoted as S1,1, S2,1, S1,2, S2,2 in the Figure) magnitude in dB as a function of frequency in GHz for such a right angle transition. Return loss is related to the degree of signal reflection that occurs when impedance does not match, i.e., at impedance discontinuities. Return loss (or reflections) generally increases with increased frequency, and may be minimized by appropriate impedance matching at and by the right angle transition. The techniques disclosed herein operate to tune the right angle transition to minimize reflections, and thus, return loss.

As shown, the S21 and S12 functions are both approximately constant functions of value 0 (see top edge of chart), and the S11 and S22 functions range from approximately −43 dB to approximately −23 dB as frequency increases from 1 GHz to 50 GHz. Note that any return loss less than −20 dB is considered to be a very good match, and that FIG. 10 indicates the effectiveness of the described techniques over an extremely broad frequency range. Since return loss is a measure of how much reflection there is coming back from the right angle launch, a −20 dB return loss simply means the signal bouncing back from the launch is 20 dB lower than the signal going in. −20 dB return loss means that the power of the reflected wave is one hundredth of the incident signal. This is considered a good match, and a better match, for instance would be a −30 dB return loss, which means that the power of the reflected signal is one thousandth that of the incident signal. Thus, the S11 and S22 traces on the graph indicate the quality of the transition (match), with the transition return loss better than 20 dB from DC out to 50 GHz.

As explained above in detail, embodiments of the present techniques provide geometries that are precise (and consistent) and complement each other to tune out parasitic impedances, and thus reduce reflections. More specifically, the capacitance added by the air dielectric between the center pin and outer conductor along with the extra capacitance added by the ground plane capacitive stub in the same air cavity may operate to tune out the extra inductance generally inherent in right angle launches.

Thus, embodiments of the techniques disclosed herein may provide a novel way to tune out extra inductance due to right angle transition in a wide band manner, and further to assemble the right angle transition so that the manufacturing variations are minimized. In other words, a result of the novel techniques disclosed is a right angle transition to a microstrip circuit with improved input return loss that is not sensitive to assembly variation, and which may be operative over the entire direct current (DC) to ~40 GHz range of the coaxial connector with better specifications then the connector itself.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A system, comprising:
- a conductive plate;
- a coaxial transmission line, comprising:
  - a center pin protruding orthogonally through a hole in the conductive plate;
  - an outer conductor formed by a conductive surface of the hole;
  - a solid dielectric surrounding the center pin and disposed within the coaxial transmission line; and
  - air dielectric between the center pin and the outer conductor;
- a circuit, parallel to the conductive plate, the circuit comprising:
  - a top conducting layer;
  - a ground plane, comprising a first cutout; and
  - an insulating substrate between the top conducting layer and the ground plane, wherein the insulating substrate of the circuit abuts the center pin of the coaxial transmission line;
  - wherein the ground plane is affixed to the conductive plate, wherein the hole in the conductive plate forms a second cutout with a larger radius than the first cutout; and
- a right angle transition from the coaxial transmission line to the circuit, wherein the right angle transition comprises:
  - the center pin of the coaxial transmission line;
  - a conductive element that electrically connects the center pin of the coaxial transmission line to the top conducting layer of the circuit;
  - the outer conductor;
  - the air dielectric between the center pin and the outer conductor;

the abutment of the insulating substrate of the circuit against the center pin of the coaxial transmission line;

the first cutout; and the second cutout wherein the abutment and the first cutout operate to minimize manufacturing variations regarding distance between the center pin and the ground plane;

wherein during operation the right angle transition tunes out inductance introduced by bonding the center pin of the coaxial transmission line to the top conducting layer, and wherein the solid dielectric of the coaxial transmission line has a larger radius than a radius of the first cutout and a radius of the second cutout.

2. The system of claim 1, wherein the conductive element that electrically connects the center pin of the coaxial transmission line to the top conducting layer of the circuit comprises a wire bond.

3. The system of claim 2, wherein the wire bond comprises a plurality of wires.

4. The system of claim 1, wherein the first cutout is coaxial with the center pin.

5. The system of claim 1, wherein the first cutout is one or more of:

circular;

elliptical;

rectangular; or polygonal.

6. The system of claim 1, wherein the ground plane is affixed to the conductive plate by a bonding medium, wherein the difference in radii of the first and second cutouts accommodates bonding medium bleed-out at the second cutout edge without causing capacitance variation that would mistune the right angle transition.

7. The system of claim 1, wherein the second cutout is coaxial with the center pin.

8. The system of claim 1, wherein the second cutout is one or more of:

circular;

elliptical;

rectangular; or polygonal.

9. The system of claim 1, wherein the conductive plate comprises a microcircuit housing.

10. The system of claim 1, wherein the circuit comprises a microstrip circuit.

11. The system of claim 1, wherein the circuit comprises a thin film circuit.

12. The system of claim 1, wherein the circuit comprises a thick film circuit.

13. The system of claim 1, wherein the circuit comprises a printed circuit board (PCB).

14. The system of claim 1, wherein during operation the right angle transition tunes out inductance introduced by bonding the center pin of the coaxial transmission line to the top conducting layer over radio frequency (RF) range.

15. The system of claim 1, wherein during operation the right angle transition tunes out inductance introduced by bonding the center pin of the coaxial transmission line to the top conducting layer from direct current (DC) to approximately 50GHz.

16. The system of claim 1, wherein the coaxial transmission line comprises a subminiature push-on (SMP) connector.

17. The system of claim 1, wherein the conductive element that electrically connects the center pin of the coaxial transmission line to the top conducting layer of the circuit comprises a ribbon bond.

18. A system, comprising:

a conductive plate;

a coaxial transmission line, comprising:

a center pin protruding orthogonally through a hole in the conductive plate;

an outer conductor formed by a conductive surface of the hole;

a solid dielectric surrounding the center pin and disposed within the coaxial transmission line; and air dielectric between the center pin and the outer conductor;

a printed circuit board (PCB), parallel to the conductive plate, the PCB comprising:

a top conducting layer;

a ground plane, comprising a first cutout; and an insulating substrate between the top conducting layer and the ground plane, wherein the insulating substrate of the PCB abuts the center pin of the coaxial transmission line;

wherein the ground plane is affixed to the conductive plate, wherein the hole forms a second cutout with a larger radius than the first cutout; and a right angle transition from the coaxial transmission line to the PCB, wherein the right angle transition comprises:

the center pin of the coaxial transmission line;

a conductive element that electrically connects the center pin of the coaxial transmission line to the top conducting layer of the PCB;

the outer conductor;

the air dielectric between the center pin and the outer conductor;

the abutment of the insulating substrate of the PCB against the center pin of the coaxial transmission line;

the first cutout; and the second cutout;

wherein the abutment and the first and second cutouts operate to minimize manufacturing variations regarding distance between the center pin and the ground plane;

wherein during operation the right angle transition tunes out inductance introduced by bonding the center pin of the coaxial transmission line to the top conducting layer, and wherein the solid dielectric of the coaxial transmission line has a larger radius than a radius of the first cutout and a radius of the second cutout.

19. The system of claim 18, wherein the ground plane is affixed to the conductive plate by a bonding medium, wherein the difference in radii of the first and second cutouts accommodates bonding medium bleed-out at the second cutout edge without causing capacitance variation that would mistune the right angle transition.

20. A system, comprising:

a coaxial transmission line, comprising a center pin, a solid dielectric surrounding the center pin and disposed within the coaxial transmission line, and an outer conductor;

a printed circuit board (PCB) comprising:

a top conducting layer;

a ground plane comprising a first cutout with a first radius; and an insulating substrate between the top conducting layer and the ground plane, wherein the insulating substrate of the PCB abuts the center pin of the coaxial transmission line to create an abutment;

a conductive plate comprising a second cutout with a second radius, wherein the center pin of the coaxial transmission line protrudes orthogonally through the second cutout, and wherein the second radius is larger than the first radius; and a right angle transition comprising a conductive element that electrically connects the center pin of the coaxial transmission line to the top conducting layer of the PCB;

wherein the abutment and the first and second cutouts operate to minimize manufacturing variations regarding distance between the center pin and the ground plane, wherein during operation the right angle transition tunes out inductance introduced by bonding the center pin of the coaxial transmission line to the top conducting layer, wherein the ground plane is affixed to the conductive plate by a bonding medium, and wherein the solid dielectric of the coaxial transmission line has a larger radius than the first radius and the second radius.

* * * * *